United States Patent
Horn

(10) Patent No.: US 8,638,602 B1
(45) Date of Patent: Jan. 28, 2014

(54) BACKGROUND SELECTION OF VOLTAGE REFERENCE VALUES FOR PERFORMING MEMORY READ OPERATIONS

(75) Inventor: Robert L. Horn, Yorba Linda, CA (US)

(73) Assignee: Western Digital Technologies, Inc., Irvine, CA (US)

(*) Notice: Subject to any disclaimer, the term of this patent is extended or adjusted under 35 U.S.C. 154(b) by 134 days.

(21) Appl. No.: 13/167,032

(22) Filed: Jun. 23, 2011

Related U.S. Application Data

(60) Provisional application No. 61/381,913, filed on Sep. 10, 2010.

(51) Int. Cl.
*G11C 11/34* (2006.01)

(52) U.S. Cl.
USPC ............ 365/185.03; 365/185.11; 365/185.17; 365/185.18; 365/185.2; 365/185.21; 365/185.22; 365/185.24; 365/189.011; 365/189.07; 365/189.09

(58) Field of Classification Search
USPC ............ 365/185.03, 185.11, 185.17, 185.18, 365/185.2, 185.21, 185.22, 185.24, 365/189.011, 189.07, 189.09
See application file for complete search history.

(56) References Cited

U.S. PATENT DOCUMENTS

| | | | |
|---|---|---|---|
| 5,875,477 A | 2/1999 | Hasbun et al. | |
| 5,956,473 A | 9/1999 | Ma et al. | |
| 6,741,502 B1 * | 5/2004 | Cernea | 365/185.29 |
| 6,888,735 B2 | 5/2005 | Nishihara | |
| 7,411,820 B2 | 8/2008 | Mo et al. | |
| 7,633,798 B2 | 12/2009 | Sarin et al. | |
| 8,270,221 B2 | 9/2012 | Lee | |
| 2008/0244339 A1 | 10/2008 | Kong et al. | |
| 2009/0024904 A1 | 1/2009 | Roohparvar et al. | |
| 2009/0129153 A1 | 5/2009 | Sarin et al. | |
| 2009/0282186 A1 | 11/2009 | Mokhlesi et al. | |
| 2009/0287956 A1 | 11/2009 | Flynn et al. | |
| 2009/0310406 A1 | 12/2009 | Sarin et al. | |
| 2010/0017684 A1 | 1/2010 | Yang | |
| 2010/0082919 A1 * | 4/2010 | Chen et al. | 711/161 |
| 2010/0162084 A1 | 6/2010 | Coulson et al. | |
| 2010/0162085 A1 | 6/2010 | Mati | |
| 2010/0169743 A1 | 7/2010 | Vogan et al. | |

* cited by examiner

*Primary Examiner* — Fernando Hidalgo

(57) ABSTRACT

A storage subsystem implements a background process for selecting voltage reference values to use for reading data from a non-volatile memory array, such as an array of multi-level cell (MLC) flash memory. The process involves performing background read operations using specific sets of voltage reference values while monitoring the resulting bit error counts. The selected voltage reference values for specific pages or other blocks of the array are stored in a table. Read operations requested by a host system are executed using the corresponding voltage reference values specified by the table.

18 Claims, 4 Drawing Sheets

BACKGROUND SELECTION OF VOLTAGE REFERENCE VALUES FOR PERFORMING MEMORY READ OPERATIONS

CROSS-REFERENCE TO RELATED APPLICATIONS

The present application claims priority from co-pending provisional U.S. Patent Application Ser. No. 61/381,913, filed on Sep. 10, 2010, the specification of which is incorporated herein by reference.

BACKGROUND

1. Technical Field

This disclosure relates to solid state memory devices that use voltage reference values to determine the states of memory cells. More particularly, the disclosure relates to processes for selecting voltage reference values to use for performing memory read operations.

2. Description of the Related Art

Flash memory devices store information in an array of memory cells constructed with floating gate transistors. In single-level cell (SLC) flash devices, each cell stores a single bit of information. In multi-level cell (MLC) devices, each cell stores two or more bits of information. When a read operation is performed, the electrical charge levels of the cells are compared to one or more voltage reference values (also called "voltage thresholds" or "threshold levels") to determine the state of each cell. In SLC devices, each cell is read using a single voltage reference value. In MLC devices, each cell is read using multiple voltage references values. Some flash devices implement commands for enabling an external memory controller to set the voltage reference values.

Various factors can contribute to data read errors in flash memory devices. These factors include charge loss or leakage over time, and device wear caused by usage. When the number of bit errors on a read operation exceeds the ECC (error correction code) correction capability of the storage subsystem, the read operation fails.

One known method for attempting to recover the data in this situation is to retry the memory read operation one or more times using adjusted voltage reference values. This process, sometimes called heroic error recovery, causes significant read latency to the host, and can cause the storage subsystem to fall below its performance specifications. As a result, heroic error recovery is generally not a useful process for extending the endurance of the storage subsystem

DETAILED DESCRIPTION OF SPECIFIC EMBODIMENTS

Specific embodiments of a storage system and an associated voltage reference testing process will now be described with reference to the drawings. This description is intended to illustrate specific embodiments of the invention, and is not intended to be limiting. Thus, nothing in this description is intended to imply that any particular component, step or characteristic is essential. The invention is defined only by the claims.

Figure 1:
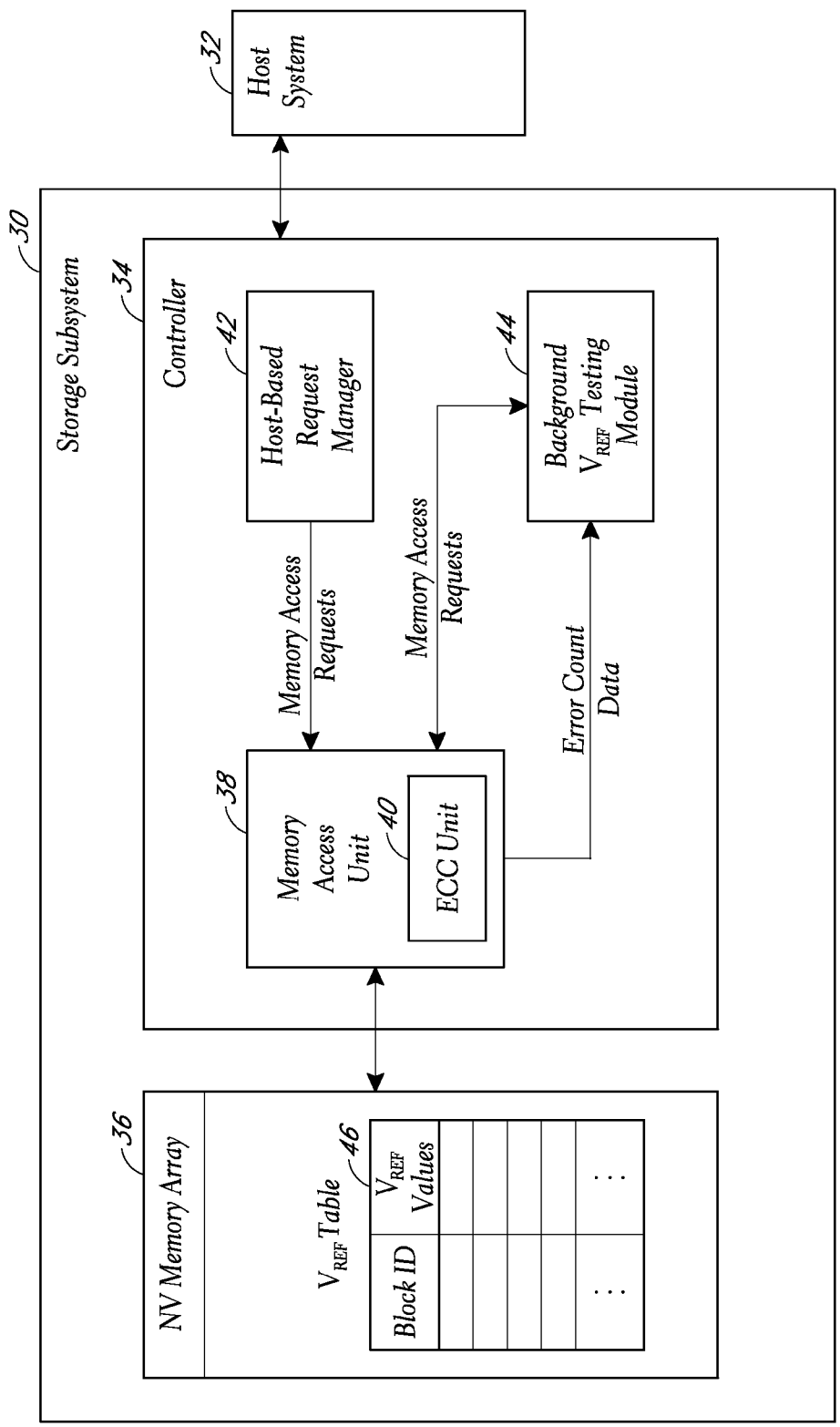
FIG. 1 is a block diagram illustrating a storage subsystem that implements a background voltage reference testing process according to one embodiment of the invention.

FIG. 1 illustrates a storage subsystem 30 that implements a background voltage reference (Vref) testing process according to one embodiment. The storage subsystem 30 is shown connected to a host system 32 that writes and reads data to/from the storage subsystem 30. The storage subsystem 30 may implement an ATA command set and interface, although other command sets and interfaces may additionally or alternatively be used.

The storage subsystem 30 includes a controller 34 that accesses an array of non-volatile (NV) solid state memory 36. The controller includes a memory access unit 38 that is responsible for accessing the memory array. The memory access unit 38 includes an ECC unit 40 that generates ECC values that are written to the memory array 36 with corresponding data. The ECC unit 40 also performs ECC checking and correction during data read operations.

The non-volatile memory array 36 is preferably implemented using NAND flash memory devices. Other types of solid-state memory devices can alternatively be used, including M-RAM (magneto-resistive RAM), PC-RAM (phase change RAM), and other devices that provide page-oriented memory access. The memory devices are preferably MLC devices that store two or more bits of data per cell, although SLC memory devices may be used in some embodiments. As is known in the art, the memory cells of the array are arranged into pages, where a page is typically the smallest writable unit of memory.

The memory devices implement commands for enabling the controller 34 to specify voltage reference values for performing read operations. Various commercially available flash memory products exist that include this capability. Typically, these products enable the controller 34 to program the memory device with a set of voltage reference values, and these values are thereafter used for subsequent page read operations until the device is programmed with different Vref values. For MLC memories that store two or more bits per cell, the set of voltage reference values typically includes multiple values, one for each threshold. For example, for devices that store two bits per cell, three voltage reference values are used. For SLC devices, the set of voltage reference values typically consists of a single value.

As explained below, the storage system 30 implements a background process for selecting the Vref values to be used for performing host-initiated read operations. This background process enables the storage subsystem 30 to realize the data-loss-prevention benefits of heroic recovery (as described above) without the performance degradation, and particularly the added read latency, caused by heroic error recovery. The process of selecting the Vref values does not require the addition of any special software or hardware to conventional host systems.

As illustrated in FIG. 1, the memory access unit 38 receives memory access requests from at least two sources: a host-based request manager 42 and a background voltage reference testing module 44. The host-based request manager 42 issues memory access requests in response to commands received from the host system 32, including data read and write commands.

The background Vref testing module 44 is responsible for maintaining a Vref table 46 in the memory array 36 and/or in other non-volatile storage of the storage subsystem 30. This table 46 stores data specifying the "current" set of Vref values for each block of the memory array 36, where a block is composed of one or more pages. Read operations initiated by the host system 32 are executed using these voltage reference values. For example, if a host command results in a read of a particular page, the memory access unit 38 will read this page using the corresponding set of Vref values specified by the table 46. In some embodiments, the table specifies the Vref values separately for each page of the array 36. In other embodiments, and particularly those in which the optimum Vref values are the same (or vary according to a known relationship) within a multi-page block, the current Vref values are stored on a less granular basis. As explained below, all or a portion of the Vref table 46 may be cached in volatile dynamic RAM.

For purposes of the remaining description, it will be assumed that MLC memory devices are used, and that each block-specific set of Vref values specified by the table 46 includes multiple values, one for each voltage threshold. As will be recognized, SLC embodiments are also possible, in which case each set of Vref values may consist of a single value.

The background Vref testing module 44 implements a background process for testing the Vref values stored in the table 46, and for updating the table with Vref values that produce reduced bit error counts. This process involves performing background page read operations with specific sets of Vref values while monitoring the resulting bit error counts. An important aspect of this process is that the Vref values are tested and updated based on non-host-initiated read operations. Thus, the testing process ordinarily does not add to the read latency experienced by the host system 32. This is in contrast to systems that, as described above, merely implement heroic error recovery by retrying failed page read operations while varying the Vref values. The potential impact on the performance seen by the host system 32 may be further reduced or eliminated by: (1) designing the memory access unit 38 to give priority to host-based memory access requests over memory access requests initiated by the background Vref testing module, and/or (2) designing the background Vref testing module 44 to initiate or perform background read operations only when no requests are pending from the host 32, or only when the storage subsystem 30 is in an idle state.

Because the Vref values for specific pages are selected in advance of their use for performing host-based reads, the likelihood of encountering uncorrectable errors on host-based read operations is significantly reduced. (As explained below, when such an uncorrectable error is encountered on a host-based read operation, heroic error recovery may still be attempted.) As a result, the storage subsystem 30 is capable of performing a greater number of program-erase cycles before the subsystem's performance falls below specifications. Thus, the endurance or useful life of the storage subsystem 30 is increased.

Figure 2:
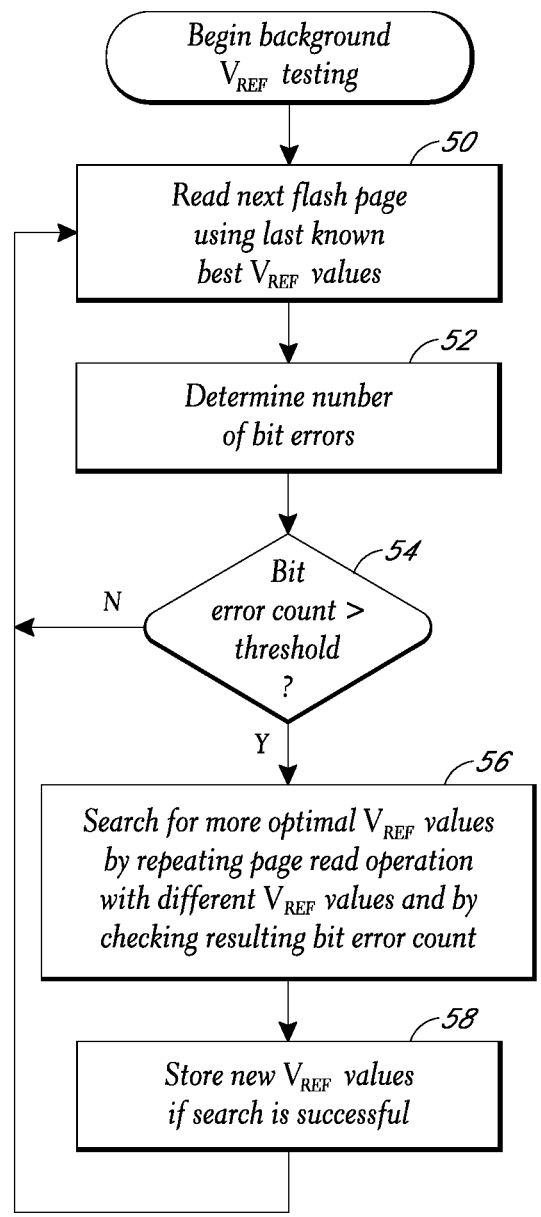
FIG. 2 illustrates a process by which voltage reference values are tested and adjusted in the storage subsystem of FIG. 1.

FIG. 2 illustrates one embodiment of the process performed by the background Vref testing module 44 to maintain the Vref table 46. This process may be implemented in firmware code executed by the controller 34; in application-specific circuitry of the controller 34; or a combination thereof. In block 50, the process initiates a read of the next (or first) page of the memory array 36 using the set of Vref values specified by the table 46 for this page. (Upon manufacture or initialization, the table 46 may be created with default sets of values.) In block 52, the process determines the resulting bit error count. The bit error count may be determined by comparing the raw data returned by the memory array 36 to the corrected version generated by the ECC unit 40. This comparison may effectively be performed by the ECC unit 40 as part of the ECC checking process, or may be performed by other circuitry of the memory access unit 38 or by firmware.

In block 54, the process determines whether the bit error count exceeds a pre-selected threshold. If the threshold is not exceeded (meaning that the bit error count is deemed acceptable), the process proceeds to the next flash page without making any changes to the table 46. If the bit error count exceeds the threshold (meaning that it is deemed unacceptable), the process initiates a search (block 56) for an alternate set of Vref values that produce a better (reduced) bit error count. This search involves repeating the page read operation at least once with a different set of Vref values, and determining whether the bit error count is improved. Any appropriate algorithm may be used for adjusting the Vref values from read-to-read during this search, including algorithms used for heroic data recovery. In one embodiment, the search of block 54 continues until either (1) a set of Vref values is found that produces an acceptable bit error count, such as a bit error count falling within the threshold, or (2) all Vref value combinations have been attempted, in which case a combination that produces the lowest bit error count is selected.

Figure 4:
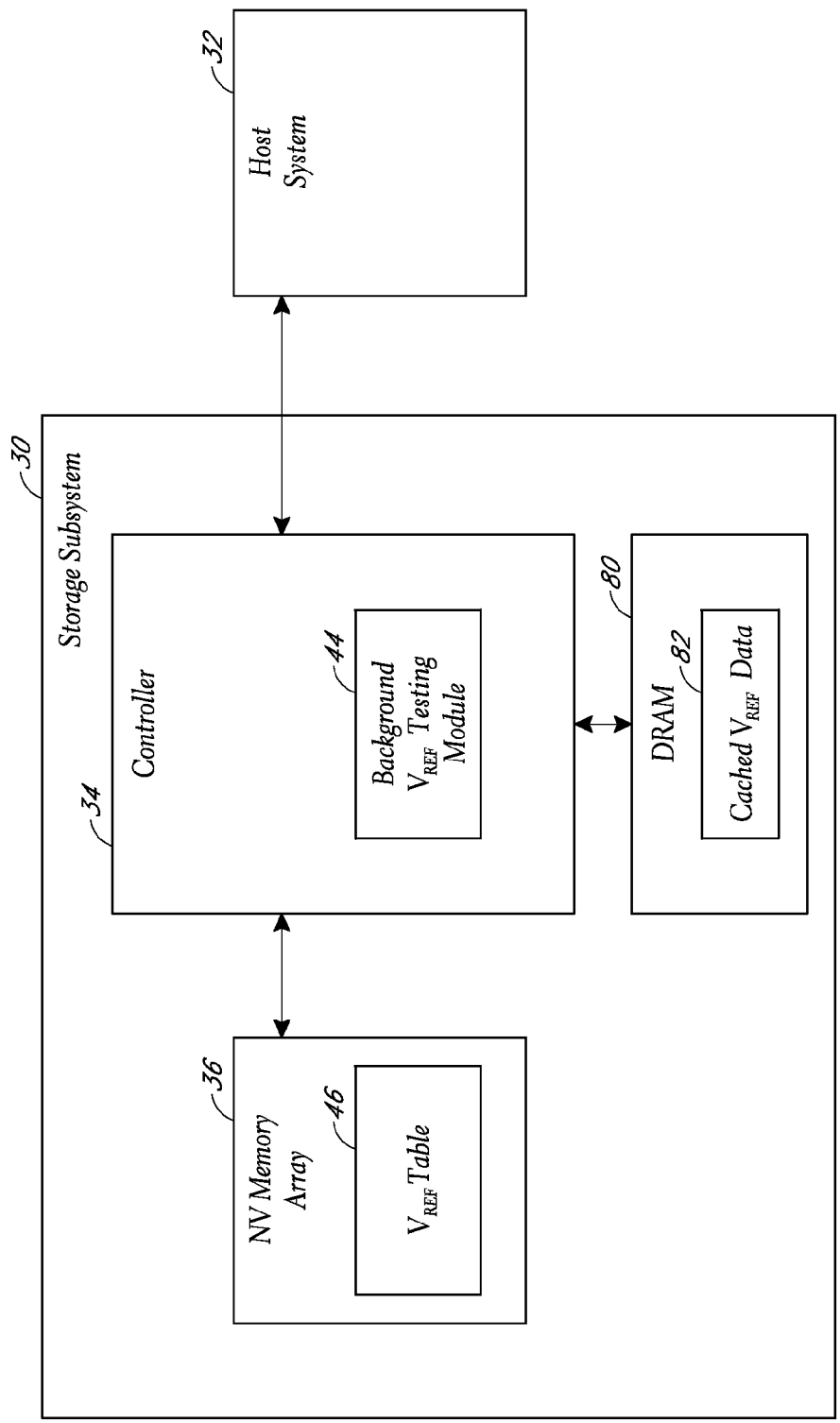
FIG. 4 illustrates one implementation of the storage subsystem of FIG. 1, and illustrates how voltage reference data may be cached in dynamic RAM.

If the search is successful, the table 46 is updated in block 58 to replace the current Vref set for the current page with the new set of Vref values. The process then proceed back to block 50 to test the next page. To reduce unnecessary write operations, the table updates may be accumulated in volatile dynamic RAM (as shown in FIG. 4 and discussed below), and these accumulated updates may be periodically flushed to the nonvolatile array 36 or other nonvolatile storage.

The sequence represented by blocks 50-58 of FIG. 2 may be repeated such that every page of the memory array 36 is tested. Alternatively, the test may be limited to a representative sample of the pages. For example, for some flash memory products, the optimum Vref values may be substantially identical for all pages within a multi-page block, or may vary within the multi-page block according to a known relationship. Where such a relationship exists, the test may be limited to one page (or a representative sample of pages) of each multi-page block, and the results may be stored in the table 46 at the multi-page block level. An appropriate media characterizing routine may be used to determine how the optimum Vref values vary from page to page for specific memory products.

For some memory products, the Vref values within a given set may also vary according to a known relationship. For example, for memory devices that store two bits per cell, if the optimum Vref value is known for one of the three thresholds, the optimum values for the other two thresholds may be derivable from this value. Where such a relationship exists, the Vref table 46 may only store one of the values of each three-value set.

As will be apparent from the foregoing description, the Vref table 46 need not store the voltage reference values themselves, but rather may store any data that directly or indirectly specifies the Vref values.

The rate at which the specific pages or blocks of the array are tested may be regulated to substantially ensure that the Vref values in the table 46 are up-to-date. This may be accomplished in various ways. As one example, where the controller 34 includes or has access to a clock or other time reference, the controller may store timestamp values in the Vref table (or elsewhere) indicating when each set of Vref values was last tested. These timestamps may be used to select specific pages or blocks to test, or to determine when to initiate background Vref testing generally. As another example, the controller 34 may keep track of when specific pages or blocks were last written, and may use this information to select pages or blocks to test. These two techniques may be used in combination.

The Vref testing rate may also be adjusted based on the wear levels of specific pages or blocks of the array 36, as may be tracked by the controller 34. As the wear level of a page increases, the memory cells of the page tend to lose charge at a faster rate, increasing the likelihood of a read error. To counteract this effect, the controller 34 may increase the Vref testing rate (e.g., the number of pages or blocks tested per unit time) in direct proportion to a measure of the overall wear level of the array. Further, if some blocks have significantly higher wear levels than others, the controller 34 may test these blocks more frequently. The Vref testing rate may also be increased in proportion to a measure of time that the storage subsystem has been in use.

In one embodiment, when the storage subsystem 30 is powered up, the controller 34 performs background Vref testing on substantially all pages or blocks of the array 36 at an increased rate. This feature is particularly desirable where the storage subsystem 30 is incapable of determining how long it was powered down, and is thus incapable of determining the amount of time since particular Vref values were last tested.

Figure 3:
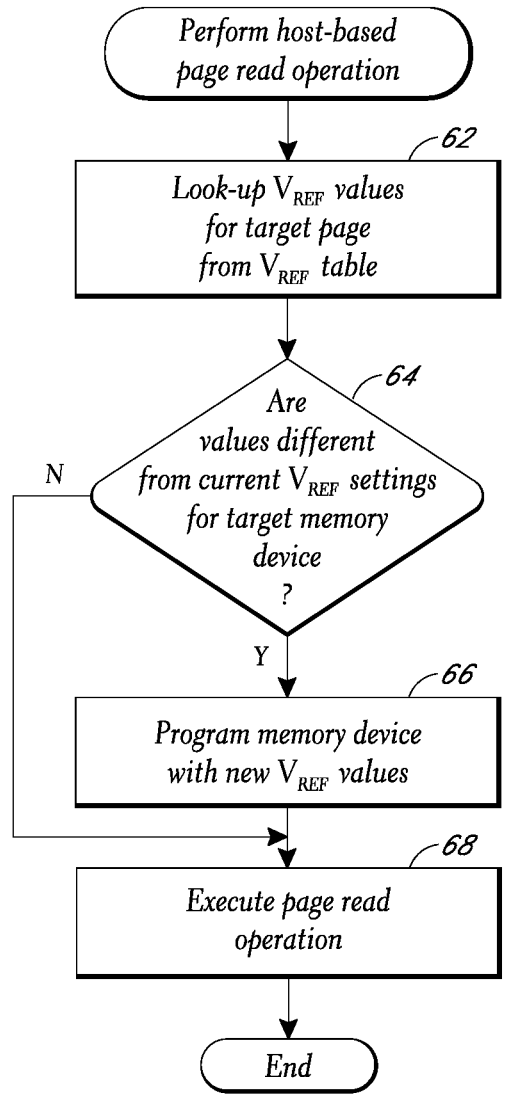
FIG. 3 illustrates a process by which the storage subsystem performs a host read operation using previously selected voltage reference values.

FIG. 3 illustrates one embodiment of a process that may be implemented by the memory access unit 38 of FIG. 1 to process a host-based page read request. This process may be implemented in firmware, in application-specific circuitry, or in a combination thereof. In block 62, the process looks up the current Vref values for the target page from the Vref table 46. A cached representation of all or a portion of the Vref table 46 may be used for this purpose. As depicted by blocks 64 and 68, if the looked-up Vref values match those currently in use by the target memory device (as tracked by the controller 34), the page read operation is performed without programming the target memory device with new Vref values. If the looked-up values differ from those currently in use, the target memory device is programmed with the looked-up Vref values (block 66) before the page read operation is performed. One variation of the process of FIG. 3 is to refrain from programming the target memory device with the new Vref values if the new values are sufficient close to those currently in use.

If the page read operation of block 68 fails as the result of the bit error count exceeding the error correction capability of the ECC unit 40, the controller 34 may use a heroic data recovery process to attempt to recover the data. If heroic recovery is successful, the Vref values used to recover the data may be written to the Vref table 46 in association with the target page or its block.

FIG. 4 illustrates an embodiment in which the controller 34 caches all or a portion of the Vref table in volatile DRAM 80. As explained above, the controller 34 may use the cached Vref table data 82 to look up the Vref values to use for host-initiated page read operations. In addition, the controller 34 may update the cached Vref data 82 with new Vref values without performing corresponding updates to the version 46 stored in non-volatile storage. As described above, table updates accumulated over time in the cache may periodically be flushed or copied to the non-volatile memory array 36.

The storage subsystem 30 may include additional components beyond those shown in FIGS. 1 and 4. For example, in some embodiments, the storage subsystem also includes a hard disk drive (HDD). Where such an HDD is present, it may be used to persistently store all or a portion of the Vref table 46.

The background Vref testing process of FIG. 2 and the modified page read process of FIG. 3 do not require the addition of any special software or functionality to conventional host systems 32.

In addition to the processes shown in FIGS. 2 and 3, the controller 34 may implement various other processes that are common within flash-based storage subsystems. For example, the controller 34 may implement a wear leveling process to distribute the wear associated with program-erase cycles substantially evenly across all pages of the memory array 36. In addition, the controller 34 may implement other processes in which non-host-initiated reads are performed from the memory array 36 for various purposes, such as redundancy coherency checking. In some embodiments, as these non-host-initiated (and/or host-initiated) reads are performed, the resulting bit error counts may be tracked and used to "inform" the Vref testing process of FIG. 2. As one example, if the bit error count on a host-initiated or non-host-initiated page read exceeds a selected threshold (such as the threshold used in block 54 of FIG. 2), an event may be generated that causes the Vref testing process of FIG. 2 to be performed on the associated page or block.

The features and attributes of the specific embodiments disclosed above may be combined in different ways to form additional embodiments, all of which fall within the scope of the present disclosure. Although certain embodiments have been disclosed, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A storage subsystem, comprising:
an array of non-volatile memory comprising solid state memory devices, said array using programmable voltage reference values to determine states of memory cells within said solid state memory devices; and
a controller configured to
write data to, and read data from, the array of non-volatile memory in response to commands received from a host system,
maintain a table that specifies, for each of a plurality of blocks of the array of non-volatile memory, a respective set of one or more voltage reference values to be used for reading data from the block, and
test and update the voltage reference values specified by the table by performing background read operations on the array while monitoring error counts that result from the background read operations performed using specific sets of voltage reference values.

2. The storage subsystem of claim 1, wherein the controller is responsive to receiving a data read command from the host system by looking up from the table, for a block corresponding to the data read command, a set of one or more voltage reference values to use for executing the data read command.

3. The storage subsystem of claim 1, wherein the controller is configured to test and update the voltage reference values stored in the table by a process that comprises:
performing a background read operation from a block of the non-volatile memory using a set of one or more voltage reference values stored in the table for said block;
determining whether an error count resulting from the background read operation exceeds a selected threshold; and when the error count exceeds the selected threshold, searching for an alternative set of one or more voltage reference values that produces a lower error count.

4. The storage subsystem of claim 3, wherein the controller is configured to search for the alternative set of one or more voltage reference values by performing additional background read operations from said block using modified voltage reference values while monitoring resulting error counts.

5. The storage subsystem of claim 1, wherein the controller is configured to adjust a rate at which it tests the voltage reference values stored in the table based on at least one of the following: (1) a wear level of the array, (2) a measure of an amount of time the storage subsystem has been in operation.

6. The storage subsystem of claim 1, wherein the controller is configured to test substantially all sets of voltage reference values in said table at a first rate when the storage subsystem is initially powered up, and to thereafter continue testing said sets of voltage reference values at a second rate that is lower than the first rate.

7. The storage subsystem of claim 1, wherein the controller is configured to select a set of voltage reference values to test based at least partly on stored data regarding an amount of time since the corresponding block was last programmed.

8. The storage subsystem of claim 1, wherein the controller is configured to store, in said table, timestamp data reflective of when specific sets of voltage reference values were last tested, and to use said timestamp data to determine when to re-test specific sets of voltage reference values.

9. The storage subsystem of claim 1, wherein the controller is additionally configured to update the table based on error data collected from memory read operations initiated by the host system.

10. The storage subsystem of claim 1, wherein the array is composed of multi-level cell (MLC) memory devices, and each of said sets of voltage reference values comprises a plurality of voltage reference values.

11. The storage subsystem of claim 1, wherein the array is composed of single-level cell (SLC) memory devices, and each of said sets of voltage reference values consists of a single voltage reference value.

12. In a storage subsystem comprising a non-volatile memory array that uses programmable voltage reference values to determine states of memory cells, a method for selecting voltage reference values to use for performing host-initiated memory read operations, the method comprising:

performing a background read operation of a block of memory of the non-volatile memory array using an initial set of one or more voltage reference values;

in response to determining that a bit error count resulting from the background read operation exceeds a selected threshold, identifying an alternate set of one or more voltage reference values that produces a reduced bit error count, wherein identifying the alternate set comprises performing at least one additional background read operation of said block; and storing data that specifies the alternate set of one or more voltage reference values for subsequent use in performing a host-initiated memory read operation of said block.

13. The method of claim 12, wherein each of said background read operations is a read of a memory page not requested by a host system.

14. The method of claim 12, wherein storing said data comprises updating a table that associates specific blocks of the memory array with respective sets of voltage reference values.

15. The method of claim 14, further comprising responding to a page read request initiated by a host system by looking up from said table a set of voltage reference values corresponding to a requested page, programming a target memory device of the memory array with the looked up set of voltage reference values, and reading the requested page from the target memory device as programmed with the looked up set of voltage reference values.

16. The method of claim 12, further comprising storing a timestamp in association with the alternate set of one or more voltage reference values, and subsequently using the timestamp to determine when to re-test the alternate set.

17. The method of claim 12, wherein the method is performed while no host-initiated memory access requests are pending.

18. The method of claim 12, wherein the block consists of a single page.

* * * * *